United States Patent [19]

Mori

[11] Patent Number: 4,943,836

[45] Date of Patent: Jul. 24, 1990

[54] ULTRAVIOLET ERASABLE NONVOLATILE SEMICONDUCTOR DEVICE

[75] Inventor: Seiichi Mori, Tokyo, Japan

[73] Assignee: Kabushiki Kaisha Toshiba, Kawasaki, Japan

[21] Appl. No.: 224,026

[22] Filed: Jul. 25, 1988

[30] Foreign Application Priority Data

Jul. 30, 1987 [JP] Japan .................. 62-190863

[51] Int. Cl.$^5$ ............... H01L 49/02; H01L 29/78; H01L 29/34
[52] U.S. Cl. ...................... 357/23.5; 357/6; 357/23.14; 357/54
[58] Field of Search ............ 357/23.5, 54, 6, 23.14; 365/185

[56] References Cited

U.S. PATENT DOCUMENTS

| | | | |
|---|---|---|---|
| 4,495,693 | 1/1985 | Iwahashi et al. | 357/23.5 |
| 4,577,390 | 3/1986 | Haken | 357/23.5 |
| 4,630,086 | 12/1986 | Sato et al. | 357/23.5 |
| 4,665,426 | 11/1987 | Allen et al. | 357/23.5 |

FOREIGN PATENT DOCUMENTS 85115571.3  6/1985  European Pat. Off. .
8312885  8/1984  France .

OTHER PUBLICATIONS

S. Mori et al., "Poly-Oxide/Nitride/Oxide Structures for Highly Reliable EPROM Cells", *1984 Symposium on VLSI Technology Digest of Technical Papers,* (Sep. 1984), pp. 40–41.

S. Mori et al., "Reliable CVD Inter-Polydielectrics for Advanced E & EEPROM", *1985 Symposium on VLSI Technology Digest of Technical Papers,* (May 1985), pp. 16–17.

*Primary Examiner*—J. Carroll
*Attorney, Agent, or Firm*—Finnegan, Henderson, Farabow, Garrett, and Dunner

[57] ABSTRACT

An ultraviolet erasable nonvolatile seimconductor device has a floating gate, a conrol gate, and a gate insulating layer interlayered between the floating gate and the control gate. The interlayered gate insulating layer consists of three layers, a first silicon oxide layer, a silicon nitride layer layered on the first silicon oxide layer, and a second silicon oxide layer. The second silicon oxide layer as the top layer of the three-layered gate insulating layer is 30 Å or less in thickness.

3 Claims, 3 Drawing Sheets

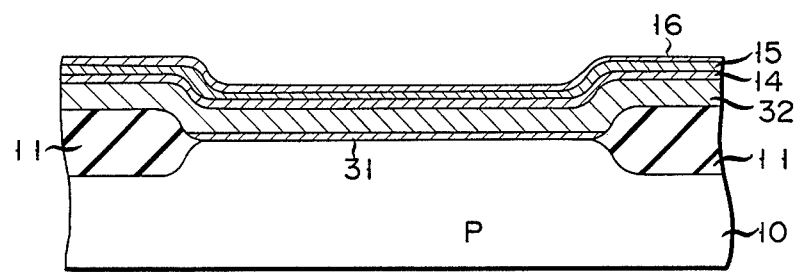
F I G. 4B
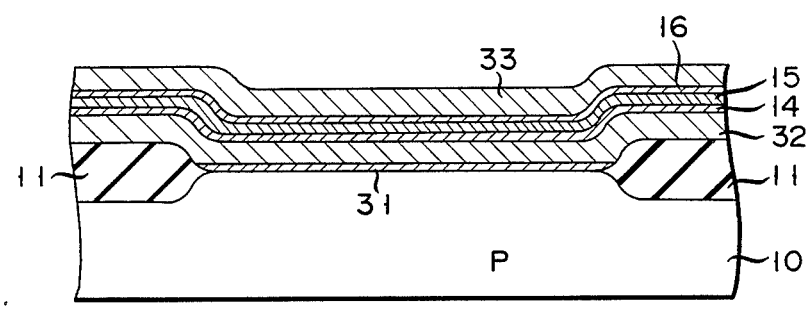
F I G. 4C
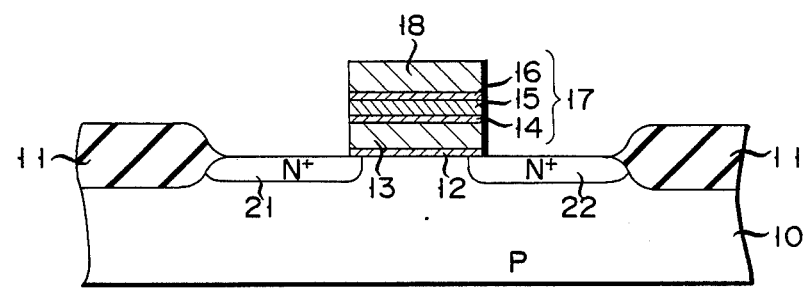
F I G. 4D

ULTRAVIOLET ERASABLE NONVOLATILE SEMICONDUCTOR DEVICE

BACKGROUND OF THE INVENTION

1. Field of the Invention

This invention relates to an ultraviolet erasable nonvolatile semiconductor device having a floating gate and a control gate, in which the stored data is erasable by irradiation of ultraviolet rays.

2. Description of the Related Art

There is known an ultraviolet erasable nonvolatile semiconductor device having a floating gate, a control gate, and an insulating layer interlayered between these gates. This type of the memory device often employs a three-layered insulating layer for that gate insulating layer interlayered between the floating gate and the control gate. The three-layered gate insulating layer consists of a silicon oxide layer, a silicon nitride layer, and silicon oxide layer. Use of the gate insulating layer of the three-layered structure improves a breakdown voltage between the floating gate and the control gate, and additionally improves a defect density of the insulating layer per se. The oxide silicon layer as the top layer of the three-layered insulating layer is usually formed by oxidizing the silicon nitride layer by burning oxidization process. When an EPROM using memory cells whose gate insulating layer laid between the floating gate and the control gate utilized a three-layered structure, is compared with that using the memory cells whose gate insulating layer consists of only a silicon oxide layer, the former is inferior to the latter in the data erase characteristic. For details of this, reference is made to "Reliable CVD Interpoly Dielectrics for Advanced E and E²PROM" in technical digest paper, page 16 in 1985 VLSI symposium. This paper describes that when the memory cell whose interlayered insulating layer utilizes a three-layered structure needs a long data erase time, approximately three times the data erase time of the memory cell whose interlayered insulating layer is a single silicon oxide layer formed by normal thermal oxidization process.

SUMMARY OF THE INVENTION

Accordingly, an object of this invention is to provide an ultraviolet erasable semiconductor device which may reduce the data erase time, while keeping high insulation and a low defect density. These are the advantages of the three-layered insulating layer which consists of a silicon oxide layer, a silicon nitride layer and a silicon oxide layer.

According to this invention, there is provided an ultraviolet erasable semiconductor device improved in that an insulating layer interlayered between the floating gate and the control gate which consists of three layers, a first silicon oxide layer, a silicon nitride layer layered on the first silicon oxide layer, and a second oxide layer layered on the silicon nitride layer, finally the second silicon oxide layer is the top layer of the three-layered insulating layer is 30 Å or less in thickness.

BRIEF DESCRIPTION OF THE DRAWINGS

FIGS. 4A to 4D show sectional views listing a sequence of process steps to fabricate the memory cell.

DETAILED DESCRIPTION OF THE PREFERRED EMBODIMENTS

Figure 1:
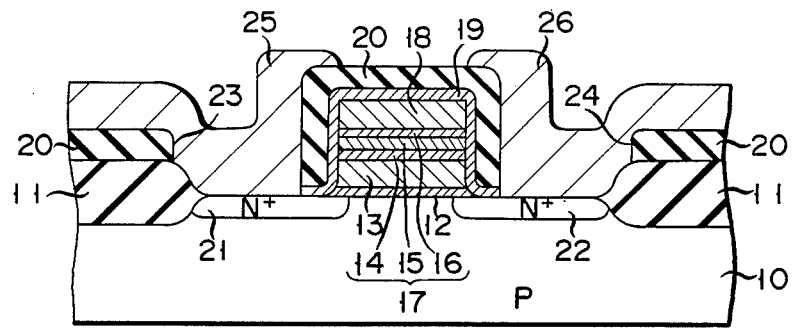
FIG. 1 shows a sectional view of the structure of a memory cell, which is used in a ultraviolet erasable semiconductor device according to this invention.

Reference is first made to FIG. 1 illustrating a cross section of one of the memory cells used in a ultra-violet erasable semiconductor device according to an embodiment of the present invention. As shown, field insulating layer 11 as a silicon oxide layer ($SiO_2$) is formed on the surface of substrate 10 made of P type silicon. Gate insulating layer 12 as a silicon oxide layer ($SiO_2$) of approximately 200 Å thick, is formed on a part of the surface of substrate 10, which is isolated by field insulating layer 11. Floating gate 13 is formed on gate insulating layer 12. Floating gate 13 is constructed with a polysilicon layer, which is doped with phosphorus, and is approximately 4000 Å in thickness. Gate insulating layer 17 of the three-layered structure is formed on floating gate 13. Gate insulating layer 17 is made up of three layers. The first layer is a silicon oxide layer ($SiO_2$) of approximately 150 Å thick. The first layer is denoted as 14, constitutes the bottom layer of the three-layered structure of gate insulating layer 17. The second layer is a silicon nitride layer ($Si_3N_4$) and is approximately 150 Å thick. The second layer is denoted as 15 and constitutes a medium layer of the three-layered structure. The third layer is a silicon oxide layer ($SiO_2$) of about 15 Å in thickness. The third layer is denoted as 16 and constitutes the top layer of the three-layered structure. Control gate 18 is formed over the three-layered gate insulating layer 17. Control gate 18 is a polysilicon layer, which is doped with phosphorus, and is about 4000 Å in thickness. Source and drain regions 21 and 22 as N+ diffusion regions are formed in the surface region of substrate 10. The layered structure made up of gate insulating layer 12, floating gate 13, three-layered structure insulating layer 17, and control gate 18, is covered with silicon oxide layer 19 and is approximately 400 Å thick. This silicon oxide layer 19 is covered further with passivation layer 20. Passivation layer 20 is further layered on the surface of field insulating layer 11. Passivation layer 20 is made of silicon oxide and is approximately 0.8 μm thick.

Contact holes 23 and 24 are respectively formed above the source and drain regions. Source lead electrode layer 25 and drain lead electrode layer 26 are formed in contact with source region 21 and drain region 22, through contact holes 23 and 24, respectively. Electrode layers 25 and 26 are made of an aluminum-silicon alloy.

As described above, in the memory cell structured as mentioned above, the gate insulating layer 17 interlayered between floating gate 13 and control gate 18 is made up of silicon oxide layer 14 as a first layer, silicon nitride layer as a second layer, and oxide layer 16 as a third layer. The thickness of the third layer 16, or the top layer of the three-layered structure is 15 Å, which is below 30 Å.

For writing data into the memory cell thus structured, a high voltage is applied to control gate 18 and drain region 22. At this time, 0 V, for example, is applied to source region 21. When such voltages are applied to the memory cell, impact ionization causes a number of electron-hole pairs to be generated in the vicinity of the drain in the channel region between the source and drain. Of those electron-hole pairs, electrons are injected into floating gate 13 and stored here.

For erasing the data thus stored in the memory cell, the memory cell is externally irradiated with ultraviolet rays. As the result of irradiation of ultraviolet rays, the electrons stored in floating gate 13 are excited, and are discharged into control gate 18 or source region 21 and drain region 22. Thus, the data is erased through the flow of the photocurrent.

As already mentioned, the thickness of the uppermost layer 16 of the gate insulating layer 17 of the three-layered structure is 15 Å which is below 30 Å. Because of this small thickness figure, in an erasure mode, the photocurrent is easy to flow from floating gate 13 to control gate 18. When the memory cell whose gate insulating layer 17 is the three-layered gate insulating layer thus structured is compared with the memory cell whose gate insulating layer 17 is the three-layered structure with top silicon oxide layer more than of 30 Å as formed by ordinary burning oxidization process, a data erase time of the former is shorter than the latter.

Figure 2:
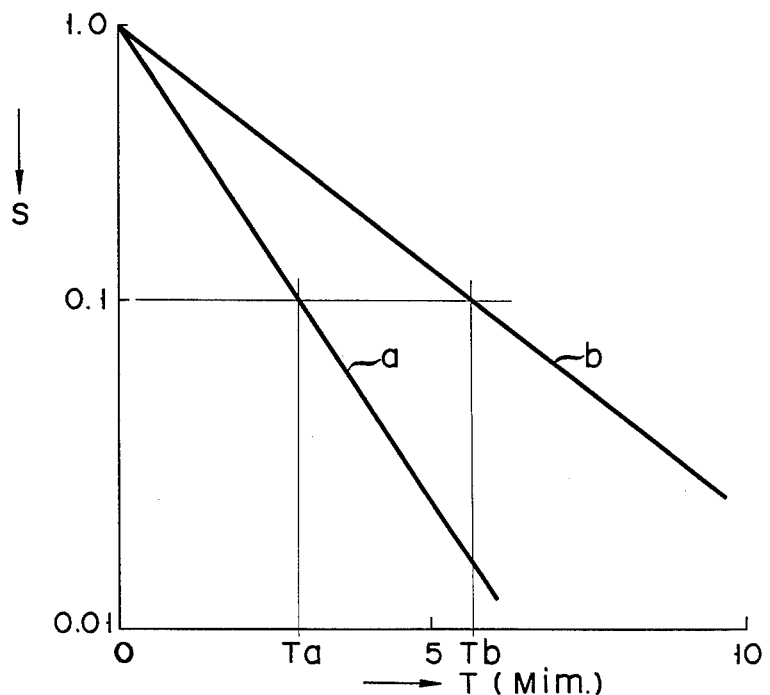
FIG. 2 graphically shows the relationship of a variation of the residual charge in a memory cell with respect to erase time.
Figure 3:
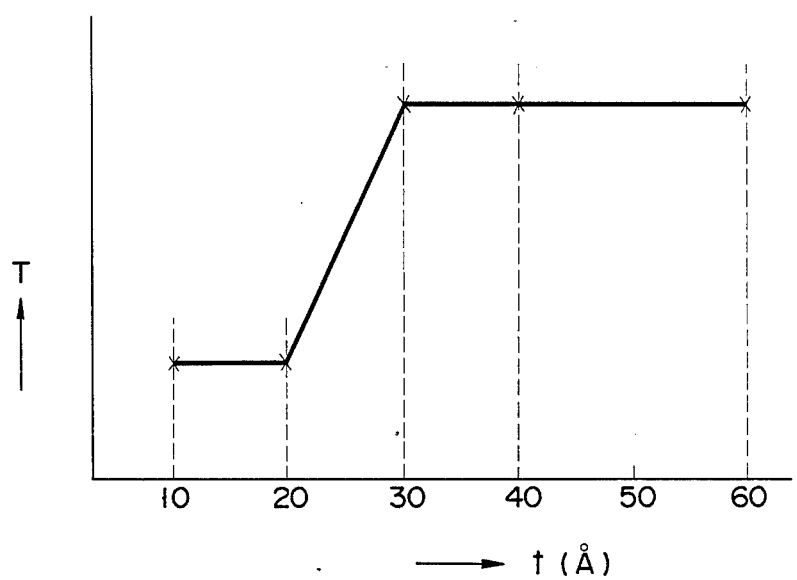
FIG. 3 graphically shows the relationship of a variation of erase time with respect to the thickness of the insulating layer of the memory cell.

Turning now to FIG. 2, a graph illustrating data erase characteristics of the prior memory cell and the memory cell of FIG. 1. In the graph, curve "a" indicates the data erase characteristic of the FIG. 1 memory cell in which the uppermost layer of the three-layered gate insulating layer is 15 Å in thickness. Curve "b" indicates the data erase characteristic of the prior memory cell in which the uppermost layer of the three-layered gate insulating layer is 60 Å. The data erase performance of the memory cell is generally described in term of the data erase time. As shown in FIG. 2, the data erase time T (min.) is expressed by the time it takes the residual charges S in the floating gate to decrease from 100 per cent (full charge in the floating gate) to 10 per cent. As seen from FIG. 2, the erase time Ta of the FIG. 1 memory cell is almost half the Tb of the prior memory cell. FIG. 3 shows a relationship of the thickness "t" (Å) of the silicon oxide layer 16 of the three-layered gate insulating layer 17 vs. data erase time T. As shown, the erase time T is almost constant over the thickness range from 10 to 20 Å. It steeply increases when the thickness is 20 to 30 Å, and reaches a peak at 30 Å which is maintained for the thickness of more than 30 Å. The FIG. 3 curve indicates that if the thickness of the top oxide silicon layer is 30 Å or less, particularly 20 Å or less, the erase time may be remarkably reduced.

In the three-layered gate insulating layer 17, when the first or bottom layer 14 is about 150 Å thick, and the second or medium layer 15 is about 150 Å, if the third or top layer 16 is selected to be 10 Å in thickness, the breakdown voltage is reduced. Therefore, the selection of such a figure for the the top layer thickness should be avoided.

A method of manufacturing the memory cell of FIG. 1 will be described referring to FIGS. 4A to 4D.

Figure 4A:
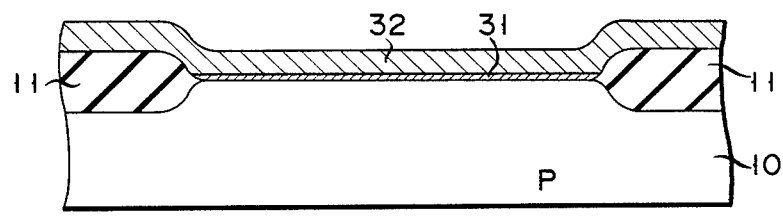

To begin with, field insulating layer 11 is formed on the surface of substrate 10 made of P type silicon by a selective oxidization process. Then, the structure is thermally oxidized, thereby to form silicon oxide layer 31 of about 200 Å thick on the surface of the element region on substrate 10. Polysilicon layer 32 of 4000 Å is deposited over the entire surface of the resultant structure. Then, the phosphorus is doped into polysilicon layer 32, with the diffusion source of POCl$_3$. (FIG. 4A).

The surface of polysilicon layer 32 is oxidized by a dilution oxide process at 1000° C., to form silicon oxide layer 14 of 150 Å, for example, on the surface of polysilicon layer 32. Subsequently, the silicon nitride layer 15 which is 150 Å thick, for example, is deposited thereover by LP-CVD process. The structure thus formed is placed in a dry oxide atmosphere so that silicon oxide layer 16 is about 15 Å thick is formed over the surface of silicon nitride layer 15. (FIG. 4B).

Following the above process step, polysilicon layer 33 of a 4000 Å thickness is deposited over the entire surface of silicon oxide layer 16, and phosphorus is diffused from the diffusion source of POCl$_3$ into polysilicon layer 33. (FIG. 4C).

Subsequently, polysilicon layer 33, silicon oxide layer 16 layered thereunder, silicon nitride layer 15, oxide silicon layer 14, polysilicon layer 32 and silicon oxide layer 31 are selectively etched through a photo engraving process in a successive manner. As a result, floating gate 13 is formed above substrate 10, with gate insulating layer 12 interlayered between them. Floating gate 13 is the etched polysilicon layer 32. Gate insulating layer 12 is the etched silicon oxide layer 31. Gate insulating layer 17 of the three-layered structure is layered over floating gate 13. This is made up of silicon oxide layer 14, silicon nitride layer 15 and silicon oxide layer 16. Control gate 18, which is originally the polysilicon layer 33, is layered over gate insulating layer 17. In the next step, arsenic ions are selectively implanted into the surface region of substrate 10, and the implanted ions are activated to form N+ type source region 21 and N+ type drain region 22. (FIG. 4D).

The structure is placed in a dry oxide atmosphere, to form silicon oxide layer 19 (FIG. 1). Silicon oxide doped with phosphorus is deposited over the structure by CVD process, to form passivation layer 20 which is 0.8 μm thick thereover. The passivation layer 20 is photoetched to form contact holes 23 and 24. Following this, an aluminum-silicon alloy layer of 1.0 μm thickness is deposited over the entire surface of the structure, and patterned to form source lead electrode layer 25 and drain lead electrode layer 26. At this point, the nonvolatile semiconductor device of the ultraviolet erasable type as shown in FIG. 1 is completed.

It should be understood that the present invention is not limited to the specific embodiment as mentioned above, but it may be changed and modified within the spirit and scope of the present invention. In the above-mentioned embodiment, the polysilicon layer 32 forming floating gate 13 is set at a 4000 Å thickness, and is doped with phosphorus. If necessary, phosphorus may be substituted with arsenic or borron. This layer 32 may be set at another proper thickness. Further, the LP-CVD process for the deposition of silicon nitride layer 15 may be substituted by direct nitride process or a plasma nitride process. In the above-mentioned embodiment, the top silicon oxide layer 16 of the gate insulating layer 17 of the three-layered structure was formed by thermally processing the surface of nitride silicon layer 15 as the substrate for the top silicon oxide layer for about 80 minutes in a dry oxide atmosphere at 950° C. Any process may be used for forming the top silicon oxide layer 16, if it can form the silicon oxide layer of a 30 Å thickness or less.

Additionally, control gate 18, which was the polysilicon layer in the above-mentioned embodiment, may consist of a high melting point polycide layer of the double layered structure, which is made up of a high melting point metal silicide layer and a polysilicon layer.

What is claimed is:

1. An ultraviolet erasable nonvolatile semiconductor device comprising:

a first conductivity-type semiconductor substrate;

source and drain regions formed in a surface of said substrate;

a first gate insulating layer consisting of a single silicon oxide layer formed on a portion of said surface between said source and drain regions;

a floating gate provided on said silicon oxide layer;

a second gate insulating layer formed on said floating gate, said second gate insulating layer consisting of a first silicon oxide layer, a silicon nitride layer formed on said first silicon oxide layer, and a second silicon oxide layer having a thickness of 30 Å or less formed on said silicon nitride layer; and a control gate provided on said gate insulating layer.

2. The semiconductor device according to claim 1, wherein the thickness of said second silicon oxide layer is 20 Å or less.

3. The semiconductor device according to claim 1, wherein when said first silicon oxide layer and said silicon nitride layer are each 100 to 200 Å in thickness, and said second silicon layer is 10 Å or more in thickness.